United States Patent
Cordes et al.

(10) Patent No.: US 6,426,241 B1
(45) Date of Patent: Jul. 30, 2002

(54) METHOD FOR FORMING THREE-DIMENSIONAL CIRCUITIZATION AND CIRCUITS FORMED

(75) Inventors: Steven A. Cordes, Cortlandt Manor; Peter A. Gruber, Mohegan Lake; James L. Speidell, Poughquag, all of NY (US); Wayne J. Howell, Williston; Thomas G. Ference, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/439,112

(22) Filed: Nov. 12, 1999

(51) Int. Cl.[7] .................. H01L 21/44; H01L 21/48; H01L 21/50; H01L 21/4763
(52) U.S. Cl. ................ 438/108; 438/124; 438/126; 438/127; 438/637
(58) Field of Search .................... 29/829, 831, 846, 29/855; 438/108, 124, 126, 127, 637, 622, 599

(56) References Cited

U.S. PATENT DOCUMENTS

| | | | |
|---|---|---|---|
| 4,700,473 A | * | 10/1987 | Freyman et al. |
| 4,746,621 A | * | 5/1988 | Thomas et al. |
| 5,638,598 A | * | 6/1997 | Nakaso et al. |
| 6,006,764 A | * | 12/1999 | Chu et al. |
| 6,035,527 A | * | 3/2000 | Tamm |
| 6,046,910 A | * | 4/2000 | Ghaem et al. |
| 6,125,531 A | * | 10/2000 | Farquhar et al. |
| 6,134,118 A | * | 10/2000 | Pedersen et al. |
| 6,143,646 A | * | 11/2000 | Wetzel |
| 6,211,487 B1 | * | 4/2001 | Hatakeyama et al. |

\* cited by examiner

Primary Examiner—John F. Niebling
Assistant Examiner—Josetta I. Jones
(74) Attorney, Agent, or Firm—Robert M. Trepp; Randy W. Tung

(57) ABSTRACT

A method for forming three-dimensional circuitization in a substrate is provided for forming conductive traces and via contacts. In the method, a substrate formed of a substantially insulating material is first provided, grooves and apertures in a top surface of and through the substrate are then formed, followed by filling the grooves and apertures with an electrically conductive material such as a solder. The method can be carried out at a low cost to produce high quality circuit substrates by utilizing an injection molded solder technique or a molten solder screening technique to fill the grooves and the apertures. The grooves and the apertures in the substrate may be formed by a variety of techniques such as chemical etching, physical machining and hot stamping.

44 Claims, 6 Drawing Sheets

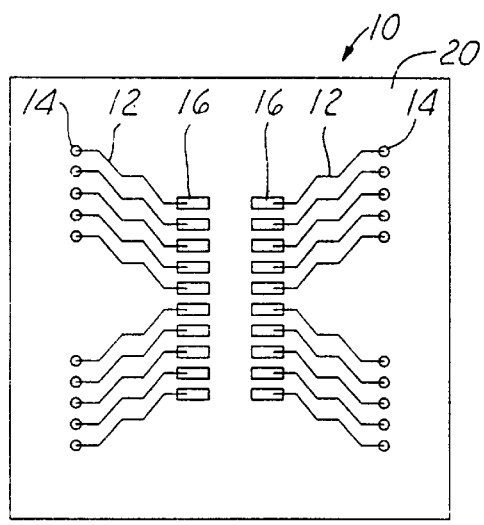
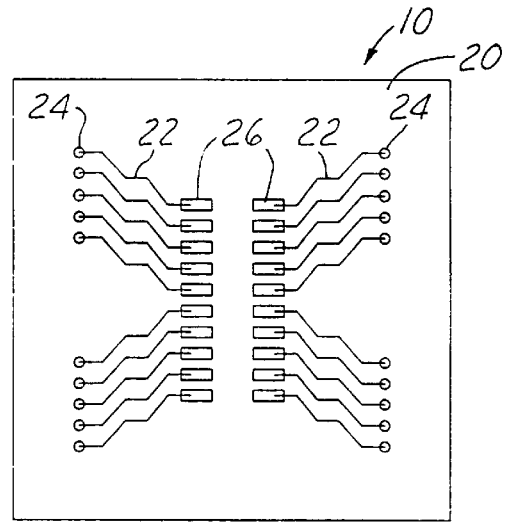
FIG. 1A
FIG. 2A
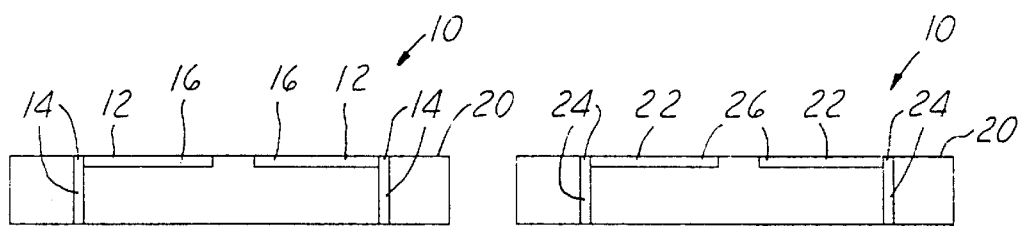
FIG. 1B
FIG. 2B
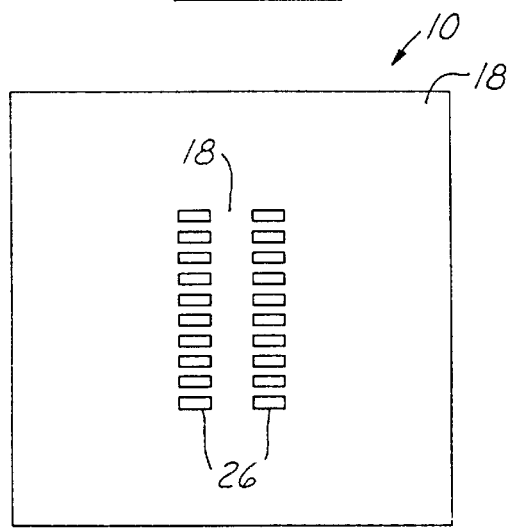
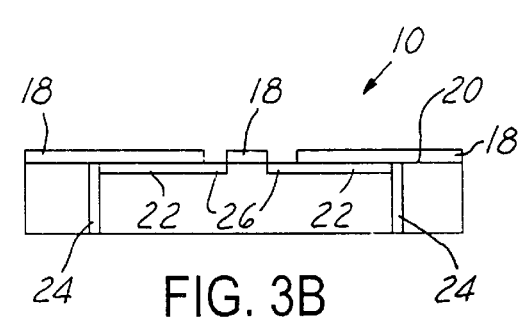
FIG. 3B
FIG. 3A

METHOD FOR FORMING THREE-DIMENSIONAL CIRCUITIZATION AND CIRCUITS FORMED

FIELD OF THE INVENTION

The present invention generally relates to a method for forming three-dimensional circuitization in a substrate and circuit formed and more particularly, relates to a method for forming conductive traces in a substrate for providing electrical communication between conductive regions by a molten solder screening technique and circuits formed by the technique.

BACKGROUND OF THE INVENTION

The circuitization process for electronic substrates usually involves several sequential processing steps. Among these steps are the initial chemical or physical machining of substrate line traces and via holes. Thereafter, the traces and holes are treated with various solutions to produce the metalized finish required to make them electrically conductive. A final step is then required to deposit joining metallurgy, usually of the solder type, to attach the electronic components. After surface grooves or via holes are first formed in the top surface or through a substrate and treated with a wetting material such as a flux, a suitable technique for filling the grooves and holes must be utilized to enable a reliable and low cost process for forming three-dimensional circuitization in the substrate. Suitable techniques that can be used for filling the grooves and holes can be selected from injection molded solder (IMS) technique or a molten solder screening (MSS) technique.

The IMS technique has been developed to replace a solder paste screening technique that is normally used in bumping semiconductor substrates. A major advantage of the IMS technique is that there is little volume change between the molten solder and the resulting solder bump. The IMS technique utilizes a head that fills boro-silicate glass molds that are wide enough to cover most single chip modules. A narrow wiper provided behind the solder slot passes the filled holes once to remove excess solder. The IMS method for solder bonding is then carried out by applying a molten solder to a substrate in a transfer process. When smaller substrates, i.e., chip scale or single chip modules (SCM's) are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped.

A more recently developed method that alleviated the limitations of the solder paste screening technique of significant volume reductions between the initial paste and the final solder volume is the molten solder screening (MSS) method. In the MSS method, pure molten solder is dispensed. When the MSS solder-bumping method is used on large substrates such as 8 inch or 12 inch wafers, surface tension alone is insufficient to maintain intimate contact between a mold and a substrate. In order to facilitate the required abutting contact over large surface areas, a new method and apparatus for maintaining such are necessary.

For instance, in a co-pending application Ser. No. 09/070,121 commonly assigned to the Assignee of the present application which is hereby incorporated by reference in its entirety, a method for forming solder bumps by a MSS technique that does not have the drawbacks or shortcomings of the conventional solder bumping techniques has been proposed. In the method, a flexible die member is used in combination with a pressure means to enable the die member to intimately engage a mold surface and thus filling the mold cavities and forming the solder bumps. The flexible die head also serves the function of a wiper by using a trailing edge for removing excess molten solder from the surface of the mold.

The MSS process can be carried out by first filling a multiplicity of cavities in the surface of a mold with molten solder. This is accomplished by first providing a stream of molten solder and then passing a multiplicity of cavities in the mold surface in contact with the surface of the stream while adjusting a contact force such that the molten solder exerts a pressure against the surface of the mold to fill the cavities with solder and to remove excess solder from the surface of the mold. The stream of molten solder is supplied through a die head constructed of a flexible metal sheet that is capable of flexing at least 0.0015 inches per inch of the die length. The solder has a composition between about 58% tin/42% lead and about 68% tin/32% lead. The multiplicity of cavities each has a depth-to-width aspect ratio of between about 1:1 and about 1:10. The mold body is made of a material that has a coefficient of thermal expansion substantially similar to that of silicon or the final solder receiving material. The contact between the multiplicity of cavities and the surface of the molten solder stream can be adjusted by a pressure means exerted on the flexible die.

The MSS method is therefore a new technique for solder bumping large 8 inch or even 12 inch silicon wafers. As previously described, the technique basically involves filling cavities in wafer-sized mold plates with molten solder, solidifying the solder and then transferring the solder in these cavities to the wafer. The transfer process requires aligning the cavities in a mold plate to the solder receiving pads on a silicon wafer and then heating the assembly to a solder reflow temperature. This results in the molten solder to metallurgically bond to the metalized pads on the wafer and thus assuring the solder in each cavity to transfer from the mold plate to the wafer. Since various solder alloys are readily processed with the MSS technique, the mold plate and wafer assembly must remain aligned throughout the reflow process. Since the contact area between mold plate and wafer covers an entire 8 inch or 12 inch silicon wafer, it is important that these materials match very closely in coefficient of thermal expansion (CTE), for instance, when the mold plate is fabricated of a borosilicate glass.

It is therefore an object of the present invention to provide a method for forming conductive traces in a substrate that does not have the drawbacks or shortcomings of a conventional method.

It is another object of the present invention to provide a method for forming conductive traces in a substrate that does not require the wet-processing technique of electrodeposition.

It is a further object of the present invention to provide a method for forming conductive traces in a substrate that is capable of producing high quality circuits at low cost.

It is another further object of the present invention to provide a method for forming conductive traces in a substrate by scanning the substrate with an injection molded solder technique.

It is still another object of the present invention to provide a method for forming conductive traces in a substrate by utilizing the molten solder screening technique.

It is yet another object of the present invention for forming conductive traces in a flexible substrate such as a polyimide film for forming flexible circuits.

It is still another further object of the present invention to provide a method for forming conductive traces and vias in a plastic laminated board in a three-dimensional circuitization.

It is yet another further object of the present invention to provide an electronic substrate which includes a substrate of insulating material and at least one surface trace and via contact filled with a conductive metal for providing electrical communication between two conductive regions.

SUMMARY OF THE INVENTION

In accordance with the present invention, a method for forming conductive traces and via contacts in a substrate and circuits formed therefrom are provided.

In a preferred embodiment, a method for forming conductive traces in a substrate can be carried out by the operating steps of providing a substrate of a substantially electrically insulating material, forming grooves and apertures in a top surface of and through the substrate, and filling the grooves and apertures with an electrically conductive material.

The method for forming conductive traces in a substrate may further include the step of forming the grooves and apertures by a technique selected from chemical etching, physical machining and hot stamping. The grooves and apertures formed are grooves for line traces and apertures for via holes. The substrate may be formed of a polymeric material, while the electrically conductive material may be a non-lead solder, or a lead-based solder. The method may further include the step of cooling the electrically conductive material until it solidifies.

The method for forming conductive traces in a substrate may further include the step of forming a passivation layer over the substrate and the grooves and apertures filled with electrically conductive material. The passivation layer may be formed of a dielectric material. The method may further include the step of forming line traces and via contacts in the insulating substrate by a molten solder screening technique. The method may further include the step of forming via contacts that provide electrical communication between line traces that are situated in different layers in the insulating substrate. The method may further include the step of forming via contacts that provide electrical communication between conductive regions in the insulating substrate.

In an alternate embodiment, a method for forming a three-dimensional circuit in a substrate can be carried out by the steps of providing an insulating substrate, forming a least two surface indentations in the insulating substrate, and filling the at least two surface indentations with an electrically conductive material.

In the method forming a three-dimensional circuit in a substrate, the insulating substrate may be fabricated of a polymeric material. The at least two surface indentations formed may include a groove and an aperture. The method may further include the step of forming a line trace and a via contact in the insulating substrate, or the step of forming a via contact for providing electrical communication between two line traces. The method may further include the step of providing electrical communication between two conductive regions by the at least two surface indentations filled with the electrically conductive metal.

In the method for forming a three-dimensional circuit in a substrate, the method may further include the step of electrically connecting two conductive regions by a conductive trace formed in one of the at least two surface indentations. The method may further include the step of electrically connecting two conductive regions by a via contact formed in the at least two surface indentations. The method may further include the step of filling the at least two surface indentations by a molten solder screening technique, or the step of filling the at least two surface indentations by an injection molded solder technique.

The present invention is further directed to an electronic substrate which includes a substrate formed of a substantially insulating material, at least one surface groove in the substrate that is filled with a conductive metal, and at least one aperture in the substrate filled with the conductive metal to provide electrical communication to the at least one surface groove filled with conductive metal.

The electronic substrate may further include a passivation layer overlying the substrate, the surface groove and the aperture. The passivation layer may be formed of a dielectric material. The electronic substrate may further include at least one line trace formed in the at least one surface groove and at least one via contact formed in the at least one aperture.

The present invention is further shown in a first implementation example of a method for forming a chip-scale package for direct chip attach that can be carried out by the operating steps of providing an IC chip that has a plurality of conductive pads formed in an active surface, attaching a pliable film that has a plurality of apertures formed therein positioned corresponding to locations of the plurality of conductive pads to the active surface of the IC chip, filling the plurality of apertures with an electrically conductive material forming a plurality of electrically conductive columns for making electrical contacts with the plurality of conductive pads, and forming a plurality of solder balls on the pliable film each in electrical communication with one of the plurality of electrically conductive columns.

In the method for forming a chip-scale package for direct chip attach, the IC chip is unitary with a semiconductor wafer. The pliable film may be a polymeric-based film, or may be made of a material selected from the group consisting of polyimide, polyamide, polyester and PTFE. The method may further include the step of filling the plurality of apertures with a high melting point solder material, or the step of filling the plurality of apertures with a solder such as 97/3 Pb/Sn. The method may further include the step of forming the plurality of solder balls on the pliable film by a technique selected from solder injection molding, solder ball preform placement and solder paste screening. The method may further include the step of forming the plurality of solder balls in an eutectic Pb/Sn solder.

The present invention is still further shown in a second implementation example of a method for forming a wafer-level package for flip chip attachment that can be carried out by the steps of providing an IC chip in a wafer that has a plurality of conductive pads formed in an active surface, attaching a pliable film that has a plurality of apertures formed therein positioned corresponding to locations of the plurality of conductive pads on the active surface of the IC chip, filling the plurality of apertures with an electrically conductive material forming a plurality of electrically conductive columns for making electrical contacts with the plurality of conductive pads, forming a plurality of conductive runners on top of the pliable film each in electrical communication with one of the plurality of electrically conductive columns, and forming a plurality of solder balls each on one of the plurality of conductive runners in electrical communication with one of the plurality of conductive pads on the IC chip through one of the plurality of electrically conductive columns.

In the method for forming a wafer-level package for flip chip attachment, the pliable film may be a polymeric-based film selected from the group consisting of a polyimide film, a polyamide film, a polyester film and a PTFE film. The method may further include the step of filling the plurality of apertures with a high melting point solder material. The step of filling the plurality of apertures with an electrically conductive material may be carried out by a screen printing or a solder injection molding technique. The method may further include the step of forming the plurality of solder balls on the pliable film by a technique selected from the group consisting of solder injection molding, solder ball preform placement and solder paste screening. The method may further include the step of forming the plurality of solder balls in an eutectic Pb/Sn solder. The method may further include the steps of severing the IC chip from the wafer, and encapsulating the IC chip in a molding compound exposing the plurality of solder balls.

The present invention is still further shown in a third implementation example of a method for forming an IC chip/leadframe package by the operating steps of providing an IC chip that has a plurality of conductive pads in an active surface, providing a leadframe that is equipped with a plurality of lead fingers for making electrical connections with the IC chip, attaching an electrically insulating film to the active surface of the IC chip and the plurality of lead fingers, the electrically insulating film has a plurality of apertures therethrough exposing the plurality of conductive pads and the plurality of lead fingers, filling the plurality of apertures with an electrically conductive material making electrical connection with the plurality of conductive pads and forming a plurality of conductive runners on top of the electrically insulating film such that each runner electrically connecting a conductive pad to a lead finger, and encapsulating the IC chip and the plurality of lead fingers in a molding compound.

In the method for forming an IC chip/leadframe package, the electrically insulating film may be a polymeric-based film selected from the group consisting of a polyimide film, a polyamide film, a polyester film and a PTFE film. The method may further include the step of providing the lead frame in a metal that includes copper. The method may further include the step of filling the plurality of apertures with a high melting point solder material. The method may further include the step of filling the plurality of apertures with an electrically conductive material by a solder injection molding or a screen printing technique.

The present invention is still further shown in a fourth implementation example of a method for forming a chip-on-flex package that can be carried out by the operating steps of providing an IC chip that has a plurality of conductive pads in an active surface, providing a flexible film equipped with a plurality of apertures and a plurality of thin film wiring on a top surface, and filling the plurality of apertures with an electrically conductive material when a bottom surface of the flexible film is positioned juxtaposed to the active surface of the IC chip such that a plurality of conductive runners are formed on the top surface of the flexible film and a plurality of conductive columns are formed in the apertures for providing electrical communication between the plurality of conductive pads on the IC chip and the plurality of thin film wiring on the flexible film.

The method for forming a chip-on-flex package may further include the step of providing the flexible film in a flexible circuitry. The method may further include the step of providing a pre-amp chip for use in a disk drive application. The method may further include the step of filling the plurality of apertures with a solder material that includes lead. The method may further include the step of filling the plurality of apertures by a solder injection molding or a screen printing technique. The method may further include the step of providing the flexible film in a material selected from the group consisting of polyimide, polyamide, polyester and PTFE.

BRIEF DESCRIPTION OF THE DRAWINGS

These and other objects, features and advantages of the present invention will become apparent from the following detailed description and the appended drawings in which:

FIG. 1A is a plane view of a substrate made of a substantially insulating material after a circuit pattern is formed by chemical etching or physical machining.

FIG. 1B is a cross-sectional view of the substrate of FIG. 1A.

FIG. 2A is a plane view of a present invention substrate after the circuit pattern is filled with a conductive metal forming traces and vias.

FIG. 2B is a cross-sectional view of the circuit substrate of FIG. 2A.

FIG. 3A is a plane view of the present invention substrate of FIG. 2A after a passivation layer is deposited on top of the substrate.

FIG. 3B is a cross-sectional view of the substrate of FIG. 3A.

DETAILED DESCRIPTION OF THE PREFERRED EMBODIMENT

Figure 4A:
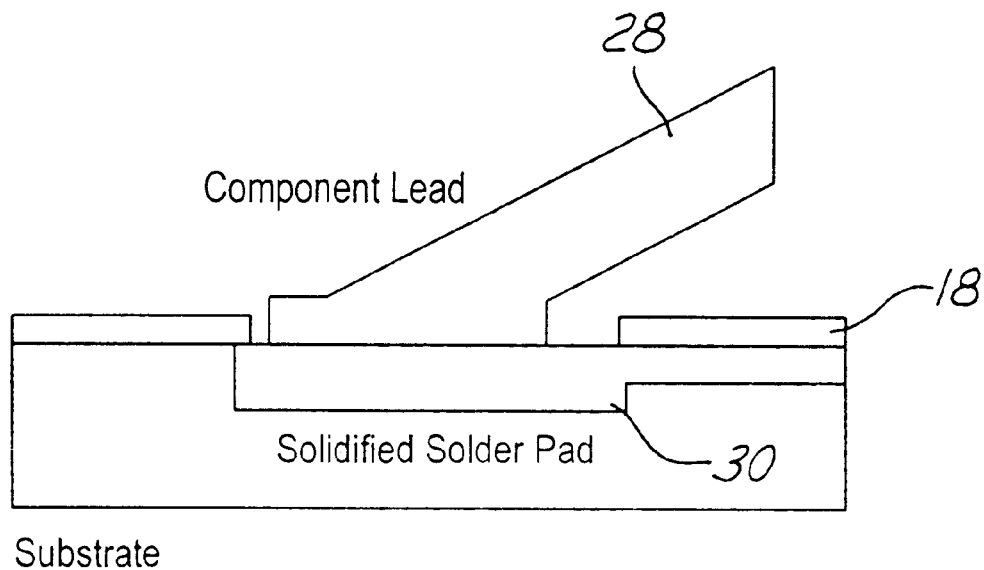
FIG. 4A is an enlarged, cross-sectional view illustrating a method for joining a component directly onto a solidified solder substrate pad before localized heating.

The present invention discloses a method for forming three-dimensional circuitization in a substrate by forming conductive traces and via contacts.

In the method, a substrate that is made of a substantially electrically insulating material is first provided. Surface grooves in a top surface of the substrate and apertures through the substrate are then formed by anyone of a variety of techniques such as chemical etching, physical machining, hot stamping, etc. The surface grooves and apertures are then filled with an electrically conductive material, such as a solder material. The present invention novel method utilizes either an injection molded solder technique or a molten solder screening technique which enables the filling process of the grooves and apertures to be accomplished at low cost and high quality circuits to be produced.

The surface grooves and apertures formed are grooves for line traces and apertures for via holes. The grooves for line traces are filled with a solder material to form conductive traces, and the via holes are filled with a conductive material to form via contacts. The conductive traces and via contacts can be used in a substrate for connecting conductive regions that are situated in the same layer or in different layers in the substrate.

The present invention further discloses a method for forming a three-dimensional circuit in a substrate by first providing an insulating substrate, forming at least two surface indentations in the insulating substrate, and then filling the at least two surface indentations with an electrically conductive material such as a solder. The surface indentations may have a large depth such that it penetrates through the thickness of the substrate. The at least two surface indentations formed may include surface grooves and via holes. After filling with a conductive metal, line traces and via contacts are formed in the insulating substrate.

The present invention further discloses an electronic substrate which consists of a substrate that is formed of a substantially insulating material, at least one surface groove in the substrate that is filled with a conductive metal, and at least one aperture in the substrate that is filled with the conductive metal to provide electrical communication to the at least one surface groove. The electronic substrate may further include a passivation layer that is deposited on top of the substrate, the surface groove and the aperture. The passivation layer is formed of a dielectric material.

In the present invention, indentations for circuit traces and via holes are first formed in the substrate by a chemical or physical method which includes chemical etching, physical machining, hot stamping, etc. After the indentations for the traces and via holes are formed, the surface of the substrate may be scanned by a molten solder screening or an injection molded solder technique for filling the indentations with a conductive metal such as a solder. The process fills any indentations or depressions in the substrate material with a high electrical conductivity solder including all circuit lines and via holes. The solder material after solidification serves both as electrical conductive lines and vias, as well as component joining metallurgy.

One of the suitable techniques for carrying out the present invention novel method is the MSS process. The MSS process is well suited for large substrates, i.e., 8 inch or 12 inch wafers, since it incorporates a flexible solder head that will follow any substrate camber. Furthermore, in most cases, the pressure-only solder supply is capable of filling both the circuit traces and the via holes.

In an alternate embodiment, when via holes have extreme depth-to-width aspect ratios, i.e., larger than 10 or even 30, the substrate can be first scanned with the injection molded solder process. The vacuum slot and vacuum link utilized in the IMS process evacuate air from the high aspect ratio via holes and furthermore, maintain the vacuum until the solder slot backfills these with molten solder. In this case, the IMS head vacuum link must be longer than the longest circuit trace to prevent cross-leaking of solder between vacuum and solder slots.

Referring now to FIG. 1A, wherein a present invention circuit substrate 10 is shown in a plane view. The circuit substrate 10 may be suitably made of silicon, FR4 for laminate, polyimide sheet, polyimide thin-film coating or any other suitable materials. The circuit substrate 10 shown in FIG. 1A has surface grooves 12, 16 and via holes 14 formed therein. The depth of the surface grooves 12, 16 and the depth of the via holes 14 are shown in a cross-sectional view of the circuit substrate 10 in FIG. 1B. The surface grooves 12, 16 and the via holes 14 can be suitably formed by a variety of techniques. For instance, they can be formed by chemical etching, physical machining, hot stamping or hot-stamp molding to form recessed traces, indentations, depressions and via holes or via openings. The horizontal line traces 12, 16 and the vertical via holes 14 can be utilized to connect two or more circuit layers. As shown in FIGS. 1A and 1B, the circuit substrate has not yet been metalized and thus the surface grooves and the via holes are not electrically conductive.

After the surface grooves 12, 16 and the via holes 14 are filled with a conductive metal, an electrically conductive path is established between the via contact 24 and the line trace 26. This is shown in FIGS. 2A and 2B. The surface grooves 12, 16 and the via holes 14 are filled with a conductive metal in a MSS or IMS process. With a single scan of the MSS or IMS process, both the horizontal (e.g., the surface grooves 12, 16) and the vertical (via the holes 14) circuit features can be filled or metalized with a conductive metal such as a solder. A three-dimensional circuit is thus formed.

After the solder material filled in the traces 12, 16 and via holes 14 has solidified, a final surface passivation layer 18 can be applied to the top surface 20 of the substrate 10. Similar to that used in standard plating metalization process, the purpose of the passivation layer 18 is to protect the metalized circuit traces 22, 26 and vias 24 from oxidation, mechanical damage, as well as providing electrical isolation. The passivation material layer 18 can be deposited by screening in which the solder pads are left uncoated due to the mask pattern. The passivation layer 18 may further be deposited by first depositing a blanket layer of the passivation material and then pattern the layer by laser ablation or other suitable techniques.

In the present invention novel method, any suitable passivation material can be used. Typically, these materials consist of polymers that are non-conductive and matched as close as possible to the coefficient of thermal expansion (CTE) of the substrate material. Depending on the circuit substrate 10, one of such family of materials that can be suitably used as a passivation layer is polyimide.

Figure 4B:
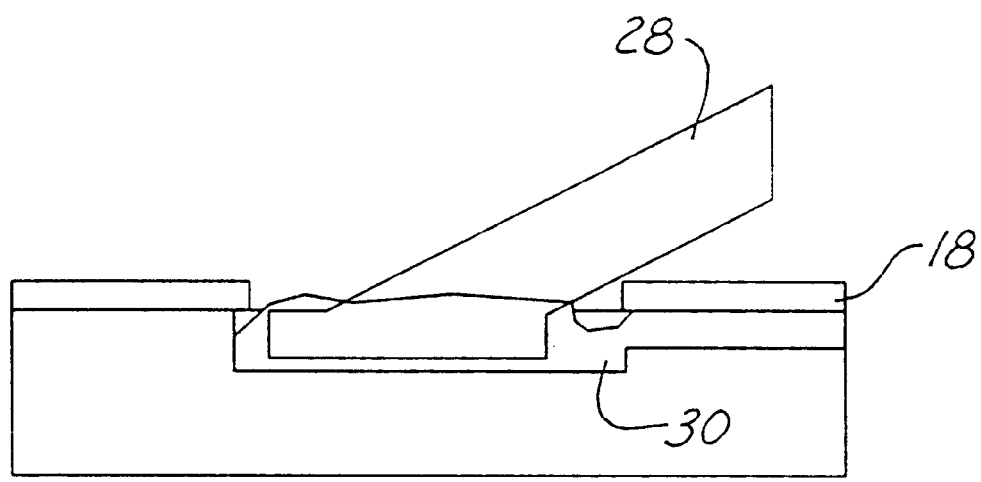
FIG. 4B is an enlarged, cross-sectional view illustrating the method of joining a component directly onto the solidified solder substrate pad after localized heating.

The present invention further enables component joining as shown in FIGS. 4A and 4B. The component joining is accomplished by placing the leads 28 or solder balls, columns, etc., of the component directly onto a solidified solder substrate pad 30. A localized heating process causes the solder pad 30 to wet the component joining member 28 which have been pre-fluxed to assure oxide reduction. In the present invention method, the surface tension of solder, i.e., 0.5 $J/M^2$, is the only limiting factor that controls the feature size. As long as the substrate features to be filled are larger than about 6 microns, the solder will enter and fill these features, whether they are line traces or via holes. FIG. 4B shows the component lead 28 is soldered to the substrate bond pad 30 after localized heating. As seen in FIGS. 4A and 4B, a passivation layer 18 further covers and protects the top surface 20 of the circuit substrate 10.

Figure 5A:
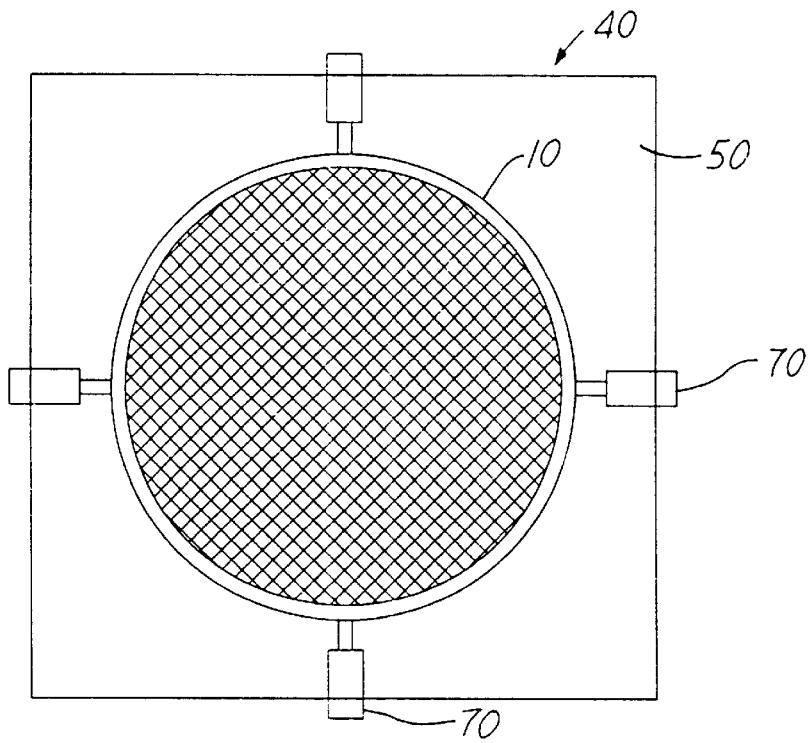
FIG. 5A is a plane view of a fixture for filling surface grooves and vias in a substrate by a molten solder screening technique.
Figure 5B:
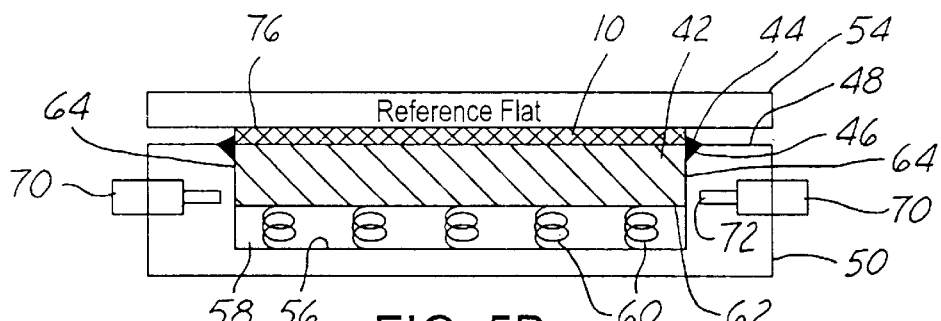
FIG. 5B is a cross-sectional view of the fixture in FIG. 5A with an alignment plate positioned on top.
Figure 5C:
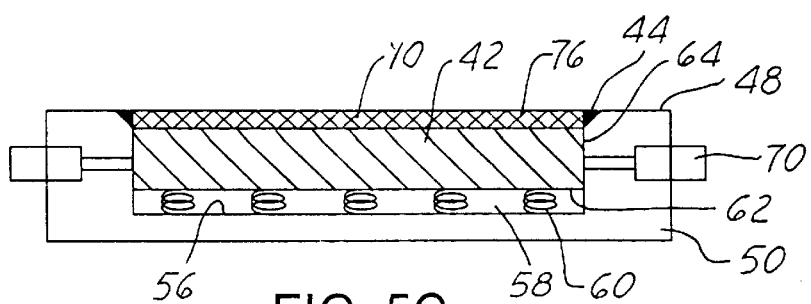
FIG. 5C is a cross-sectional view of the fixture of FIG. 5B with the spring base plate and the wafer carried by the plate mounted in the fixture frame.

A typical method for filling the grooves and apertures with a molten solder screening technique is shown in FIGS. 5A, 5B and 5C. A novel aspect of the MSS technique is the use of a fixture 40 which the circuit substrate 10 is joined to for providing necessary mechanical features for the process. As shown in FIG. 5A, the planarizing and squaring-up fixture 40 assures that the MSS head does not hang over the edge of the circuit substrate 10 at the start and at the end of the scanning process. Since the solder slot in a MSS head is wide enough to cover the entire area of a circuit substrate, such as an 8 inch or a 12 inch wafer, run-on and run-off areas would cause the solder to spill where the head overhangs the wafer edge.

To prevent the spilling of solder, fixture 40 is therefore used to square-off the round circuit substrate 10. The mounting of the circuit substrate 10 into the planarizing fixture 40 can be carried out by first placing the circuit substrate 10 on a circular-shaped spring base plate 42 which has a slightly larger diameter than the circuit substrate 10. A high temperature putty ring 44 such as a partially cured silicone rubber, etc., is then placed in and around the outer edge gap 46. Since the top surface 18 of the circuit substrate 10 and the top surface 48 of the fixture frame 50 must be on exactly the same plane, a reference flat plate 54, or an alignment plate is placed on top of the circuit substrate 10 and pushed down until it bottoms out against the top surface 48 of the fixture frame 50. A plurality of spring means 60 are positioned between a bottom surface 56 of the cavity 58 and a bottom surface 62 of the spring base plate 42 for pushing the spring base plate 42 outwardly away from the cavity 58.

After the reference flat plate 54 bottoms out on the fixture frame 50, four mechanical locking means 70 are activated which lock the spring base plate 42 into a planarized position. The mechanical locking means 70 may be suitably bolts that threadingly engage a threaded hole (not shown) in the fixture frame 50 with a tip 72 of the bolt 70 exerting a compressive force on a peripheral edge 64 on the spring base plate 42. The mechanical locking means 70 locks the spring base plate 42 such that the relative position between the plate 42 and the fixture frame 50 is fixed.

The reference flat plate, or the alignment plate 54 which is used to assure planarity between the circuit substrate top surface 76 and the top surface 48 of the fixture frame 50 can now be removed.

To assure absolute planarity, the putty ring 44 may be trimmed by running a razor edge along the gap between the circuit substrate parameter and the fixture frame 50. The circuit substrate/fixture assembly 40 is then ready for the molten solder screening process in which a molten solder dispensing head (not shown) scans and fills the entire wafer. The fixture frame 50 provides the run-on and run-off areas required to prevent the solder from spilling out.

IMPLEMENTATION EXAMPLES

In the present invention novel method, the initial circuit traces of surface grooves and via holes may be formed by a variety of techniques. One of the techniques is a hot stamp molding method which can be suitably used to form depressions in a substrate material that is most likely a hot stampable plastic. The surface grooves and via holes thus appear as actually hot-stamp molded into the substrate material. The limitation of such a low cost method for producing the solder receiving depressions is that it can only be used in certain substrate materials such as plastic laminates.

The present invention novel method is greatly improved over that of a deep solid solder deposit (DSSD) method which has been developed by others. The DSSD method utilize a technique similar to wave soldering for filling depressions with a molten solder. However, the DSSD method relies on solder surface tension and pre-metalized depressions by electroplating for solder fills. To the contrary, the present invention three-dimensional circuitization method requires none of the preliminary substrate processing, i.e., electroplating, to metalize the depressions. Furthermore, neither the MSS nor the IMS technique relies on surface tension to separate the cavity and the supply solder volumes and are thus much more precise in their cavity filling characteristics.

The present invention novel method can be used in a variety of applications. For instance, in fabricating flexible circuits on a polyimide film such as Kapton® TM; in standard circuitization of plastic laminated boards, and in thin film (polyimide) redistribution layers on silicon or glass-ceramic substrates. The present invention is further applicable in processes for building a multi-layer circuit by filling sequentially deposited layers of polyimide with a solder material. As long as each succeeding layer is aligned and patterned in such a way as to complete electrical path with the previous layer, the present invention novel method enables many layers to be stacked together. The solder material should be solidified before each new layer is deposited. While solder material does not have the same electrical conductivity of copper or gold, it is sufficient for many low cost applications. Furthermore, in certain applications, a final gold flashing technique may be used in high frequency applications, such as in communications.

The present invention novel method of three-dimensional circuitization presents a variety of novel features such as eliminating the need for wet-processing, i.e., plating, circuit substrates; circuitizing line traces and via holes simultaneously with electrically conductive solder; eliminating the need for additional solder for component attach; and producing multi-layer circuits or thin-film redistributions by processing sequentially deposited layers.

The present invention novel method for three-dimensional circuitization can best be demonstrated in the following implementation examples.

Figure 6:
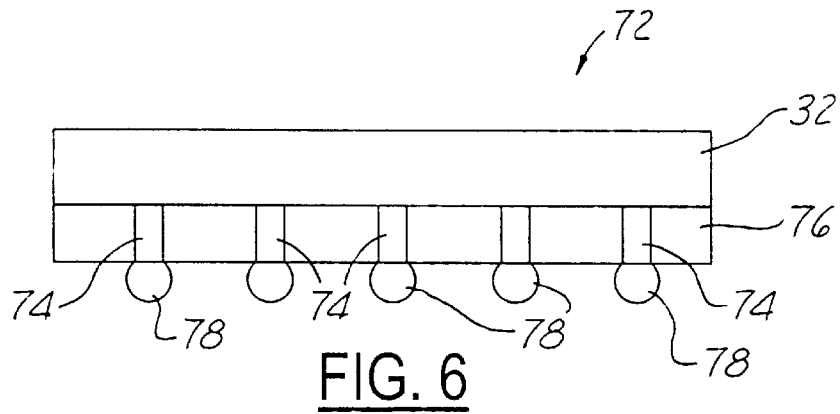
FIG. 6 is an enlarged, cross-sectional view of a first implementation example of the present invention novel method for direct chip attach of a chip-scale package.

In the first implementation example, as shown in FIG. 6, a direct chip attach chip-scale package 72 is provided. In the chip-scale package 72, the cost and processing advantages made possible by the present invention novel method described above are realized. Specifically, the solder injection molded circuitry and the interconnect technology are used to create chip to package/board interconnections. A solder column, such as 97/3 Pb/Sn is encapsulated in a polymeric-based material layer 76, which is initially attached to wafer 32. A suitable polymeric-based layer may be formed of a material such as polyimide, polyamide, polyester or PTFE. The solder columns 74 encapsulated in the polymeric material layer 76, are used to accommodate chip-to-board thermal expansion mismatch and thereby, precluding the need for encapsulating the eutectic solder balls 78 which is also deposited at the wafer level, for instance, by a solder injection molding technique. Alternative methods for depositing the eutectic solder balls 78 may include solder ball preform placement (pick and place) and solder paste screening. By utilizing the present invention novel method, the package may be created entirely at the wafer-level without utilizing expensive back end of line processing technologies to deliver the required interconnection density. After the deposition of the eutectic solder balls, each chip/package component may be severed from the wafer using conventional wafer dicing processes.

Figure 7A:
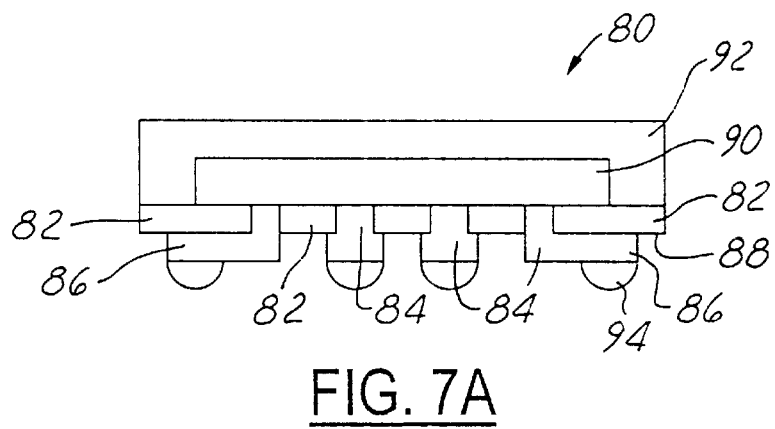
FIG. 7A is an enlarged, cross-sectional view of a second implementation example of the present invention method of a flip chip attachment from a wafer-level package.
Figure 7B:
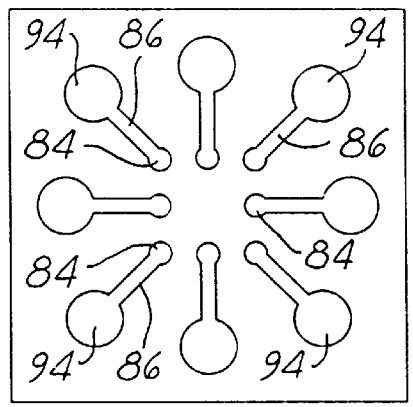
FIG. 7B is a plane view of the second implementation example shown in FIG. 7A.

In a second implementation example, shown in FIGS. 7A and 7B, a flip chip micro-package formed between a flip chip and a package/board is provided. The package 80 shown in FIG. 7A is suitable for applications wherein the number of chip-to-package interconnections requires the use of an interconnection configuration that can be best accomplished by the present invention novel solder injection molded circuitry and interconnect technology. In this example, discrete chips can be attached to a large format PTFE film 82, or to any other suitable polymeric-based film. A solder injection molding technique is used to create both solder columns, such as 97/3 Pb/Sn within the film 82, and fan-out or space transformation circuitry 86 on the surface 88 of the film. The surface circuitry 86, comprised of solder, such as 97/3 Pb/Sn, is created during the same solder injection molding process that is used to create the solder columns 84. Similar to the direct chip attach chip-scale package method shown in the first implementation example, the solder columns 84 are used to accommodate the thermal expansion mismatch between the chip 90 and the package/board. The package 80 is completed by encapsulating the chip 90 and the exposed polymeric film 82 in an injection molded plastic compound 92. The package 80 is then severed from the large-format film by using standard dicing procedures.

The large-format film enables one to realize the cost advantages associated with multi-component processes, similar to that achieved with wafer-scale packaging. FIG. 7B is a plane view of the package 80 shown in FIG. 7A illustrating the fan-out pattern. The solder balls 94 are formed by a material similar to that used in the first implementation example for solder balls 78, i.e., a low temperature solder material such as an eutectic Pb/Sn. As shown in FIG. 7B, the implementation example clearly demonstrates that the present invention method enables fan-in and fan-out in forming various I/O configurations.

Figure 8A:
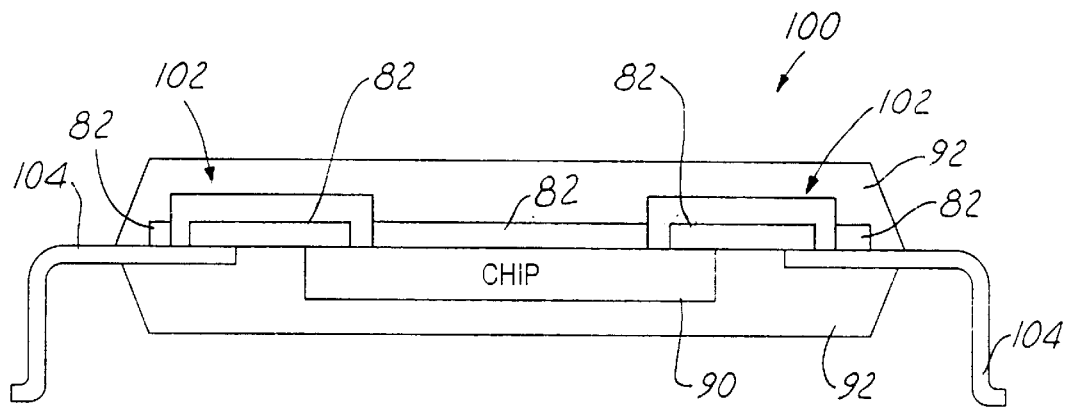
FIG. 8A is an enlarged, cross-sectional view of a third implementation example of the present invention method for forming an IC chip/leadframe package.
Figure 8B:
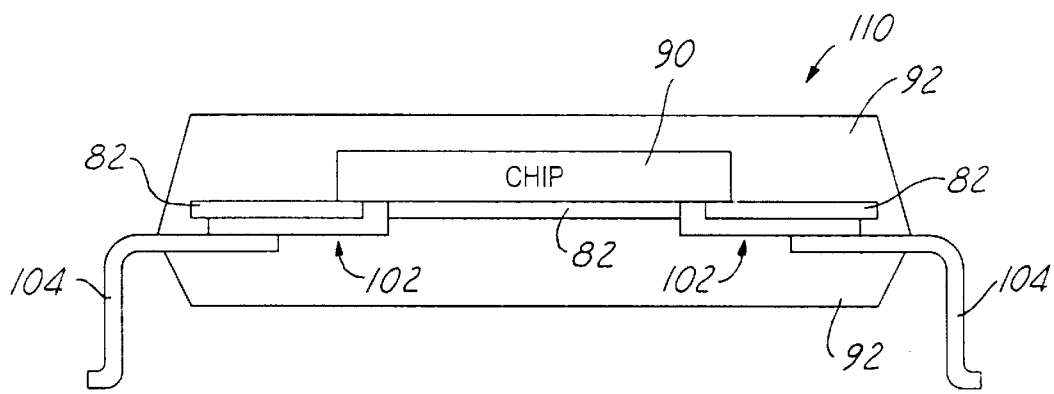
FIG. 8B is an enlarged, cross-sectional view of an alternate embodiment of the present invention method for forming an IC chip/leadframe package.

A third implementation example of the present invention novel method is shown in FIGS. 8A and 8B. In this implementation example, an IC chip/leadframe package 100 or 110 is formed. In the leadframe package 100 shown in FIG. 8A, similar to the fan-out circuitry described above, a solder injection molding technique is used to create interconnection circuitry 102 between a chip 90 and a leadframe 104. Due to a drastic difference in the fabrication technologies used to form the leadframes compared with the chip back-end-of-line interconnects, a high degree of space transformation is required to interconnect chip 90 to the lead frame 104. The present invention novel solder injection molded circuitry is used to eliminate interconnection density limitations in conventional wire bonding technology and to provide substantially higher chip perimeter densities. The novel leadframe package 100, 110 enables smaller chips to be fabricated and therefore increasing wafer productivity and reducing chip cost.

In this implementation example, a high lead content solder, i.e., 97/3 Pb/Sn solder is used to form the interconnection circuitry 102. The leadframe can be provided in a copper foil or a copper alloy foil. A chip-down configuration is shown in FIG. 8A, while a chip-up configuration is shown in FIG. 8B. A plastic encapsulation material 92 is used to encapsulate the formed package. As in previous implementation examples, a polymeric-based pliable film 82 is used to provide apertures and a surface for forming the injection molded interconnection circuitry 102 between the chip 90 and the leadframe 104.

Figure 9A:
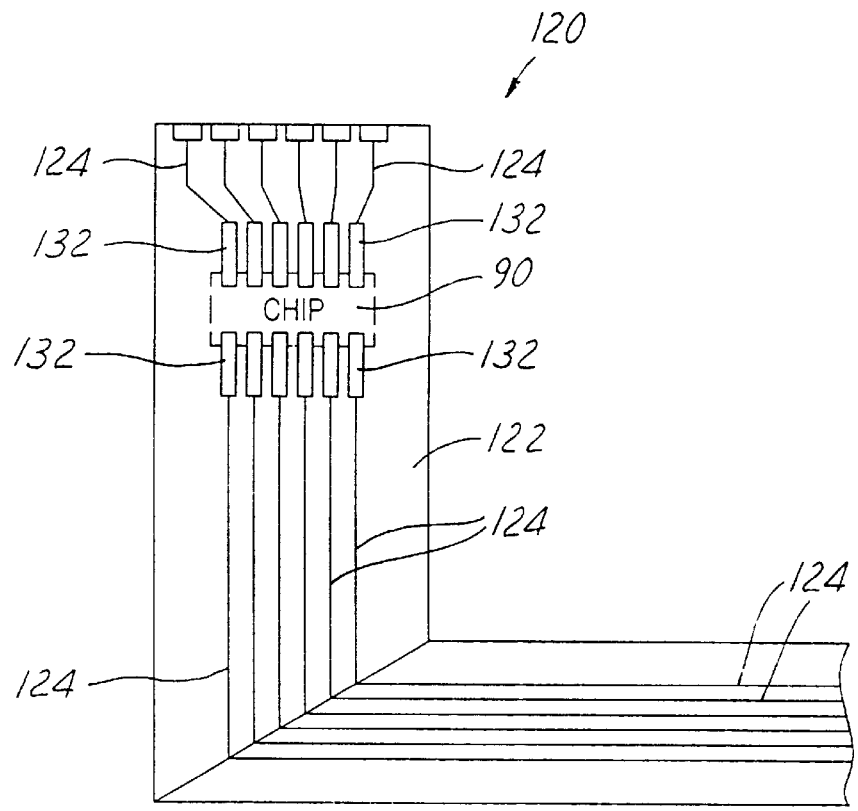
FIG. 9A is a plane view of a fourth implementation example of the present invention method for forming a chip-on-flex package.
Figure 9B:
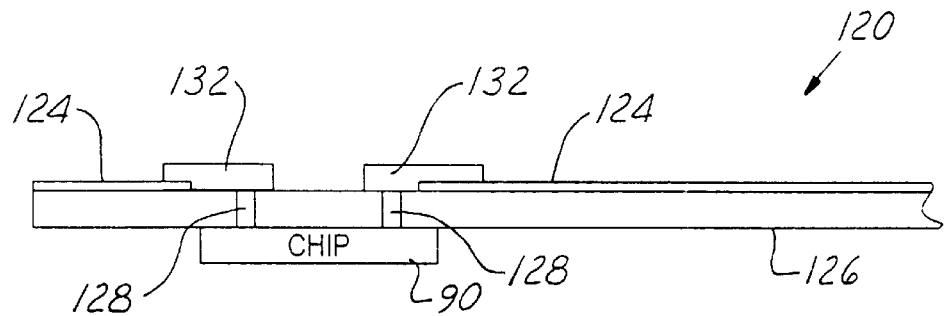
FIG. 9B is a cross-sectional view of the fourth implementation example of the chipon-flex package of FIG. 9A.

In the fourth implementation example of a chip-on-flex package 120, shown in FIGS. 9A and 9B, the present invention novel method of a solder injection molded circuitry, or a solder molded interconnection circuitry is used. The chip-on-flex package 120 is typically used in connecting a pre-amp chip to a flexible circuitry 122 in disk drive applications. Since there are critical space constraints in disk drives, the present invention solder injection molded circuitry is used to substantially eliminate inherent interconnection density limitations encountered in conventional wire bonding technology. The space constraints manifest themselves at the chip interconnect level in both the overall height and the X-Y area constraints. The conventional wire bonding technology requires a minimum pitch both on chip and for the second bond pads on the flex film. The minimum pitch requirement limits the X-Y area reduction for the chip/wire bond interconnections. Additionally, wire bonding technology has minimum wire bond loop height constraints which impact the minimum chip/wire bond interconnection height. The present invention novel solder injection molded circuitry can be advantageously used to substantially eliminate these two critical dimensional constraints when used in interconnect technology to interconnect the chip and the flexible circuitry.

FIG. 9B is a cross-sectional view of the chip-on-flex package 120 shown in FIG. 9A. It is seen that a flexible circuit 122 is first provided with thin film wiring 124 formed thereon. A chip 90 is then attached to the bottom side 126 of the flexible circuit 122 by performing a solder injection process in which a plurality of solder columns 128 and a plurality of solder runners 132 are formed for providing electrical communication between conductive pads (not shown) on the active surface of chip 90 and the thin film wiring 124. The IC chip 90 may be a pre-amp chip that is connected to the flexible circuit 122 for use in a disk drive application. The solder material used for forming the solder columns 128 and the solder runners 132 may be a high lead content solder such as a 97/3 Pb/Sn solder in an injection molding process utilizing a patterned screen.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming conductive elements in a substrate comprising the steps of:

providing a substrate of a substantially electrically insulating material, forming grooves and apertures in a top surface of and through said substrate, filling said grooves and apertures with an electrically conductive material, cooling said electrically conductive material until it solidifies, and forming a passivation layer over said substrate and said grooves an apertures filled with electrically conductive material.

2. A method for forming conductive elements in a substrate according to claim 1 further comprising the step of forming said grooves and apertures by a technique selected from the group consisting of chemical etching, physical machining and hot stamping.

3. A method for forming conductive elements in a substrate according to claim 1, wherein said grooves and apertures formed are grooves for line traces and apertures for plugs.

4. A method for forming conductive elements in a substrate according to claim 1, wherein said substrate is formed of a polymeric material.

5. A method for forming conductive elements in a substrate according to claim 1, wherein said electrically conductive material is a solder.

6. A method for forming conductive elements in a substrate according to claim 1, wherein said electrically conductive material is a lead based solder.

7. A method for forming conductive elements in a substrate according to claim 1, wherein said passivation layer is formed of a dielectric material.

8. A method for forming conductive elements in a substrate according to claim 1 further comprising the step of forming line traces and via contacts in said insulating substrate by a molten solder screening technique.

9. A method for forming conductive elements in a substrate according to claim 1 further comprising the step of forming via contacts that provide electrical communication between conductive regions in said insulating substrate.

10. A method for forming conductive elements in a substrate according to claim 1 further comprising the step of forming via contacts that provide electrical communication between conductive regions in said insulating substrate.

11. A method for forming a three-dimensional circuit in a substrate comprising the steps of:
    providing an insulating substrate,
    forming at least two surface indentations in said insulating substrate,
    filling said at least two surface indentations with an electrically conductive metal, and
    providing electrical communication between at least two conductive regions formed by said at least two surface indentations filled with said electrically conductive metal.

12. A method for forming a three-dimensional circuit in a substrate according to claim 11, wherein said insulating substrate is fabricated of a polymeric material.

13. A method for forming a three-dimensional circuit in a substrate according to claim 11, wherein said at least two surface indentations formed comprises a groove and an aperture.

14. A method for forming a three-dimensional circuit in a substrate according to claim 11 further comprising the step of forming a line trace and a via contact in said insulating substrate.

15. A method for forming a three-dimensional circuit in a substrate according to claim 11 further comprising the step of electrically connecting said at least two conductive regions by a conductive trace formed in one of said at least two surface indentations.

16. A method for forming a three-dimensional circuit in a substrate according to claim 11 further comprising the step of electrically connecting said at least two conductive regions by a via contact formed in said at least two surface indentations.

17. A method for forming a three-dimensional circuit in a substrate according to claim 11 further comprising the step of filling said at least two surface indentations by a molten solder screening technique.

18. A method for forming a three-dimensional circuit in a substrate according to claim 11 further comprising the step of filling said at least two surface indentations with a solder material.

19. A method for forming a chip-scale package for direct chip attach comprising the steps of:
    providing an IC chip having a plurality of conductive pads formed in an active surface,
    attaching a pliable film having a plurality of apertures formed therein positioned corresponding to locations of said plurality of conductive pads to said active surface of said IC chip,
    filling said plurality of apertures with an electrically conductive material forming a plurality of electrically conductive columns for making electrically contacts with said plurality of conductive pads, and
    forming a plurality of solder balls on said pliable film each in electrical communication with one of said plurality of electrically conductive columns.

20. A method for forming a chip-scale package for direct chip attach according to claim 19, wherein said IC chip is situated on a semiconductor wafer.

21. A method for forming a chip-scale package for direct chip attach according to claim 19, wherein said pliable film is a polymeric-based film.

22. A method for forming a chip-scale package for direct chip attach according to claim 19, wherein said pliable film is made of a material selected from the group consisting of polyimide, polyamide, polyester and PTFE.

23. A method for forming a chip-scale package for direct chip attach according to claim 19 further comprising the step of filling said plurality of apertures with a high melting point solder material.

24. A method for forming a chip-scale package for direct chip attach according to claim 19 further comprising the step of filling said plurality of apertures with a solder such as 97/3 Pb/Sn.

25. A method for forming a chip-scale package for direct chip attach according to claim 19 further comprising the step of forming said plurality of solder balls on said pliable film by a technique selected from solder injection molding, solder ball preform placement and solder paste screening.

26. A method for forming a chip-scale package for direct chip attach according to claim 19 further comprising the step of forming said plurality of solder balls in an eutectic Pb/Sn solder.

27. A method for forming a wafer-level package for flip chip attachment comprising the steps of:
    providing an IC chip in a wafer having a plurality of conductive pads formed in an active surface,
    attaching a pliable film having a plurality of apertures formed therein positioned corresponding to locations of said plurality of conductive pads on said active surface of said IC chip,
    filling said plurality of apertures with an electrically conductive material forming a plurality of electrically conductive columns for making electrical contacts with said plurality of conductive pads,
    forming a plurality of conductive runners on top of said pliable film each in electrical communication with one of said plurality of electrically conductive columns, and
    forming a plurality of solder balls each on one of said plurality of conductive runners in electrical communication with one of said plurality of conductive pads on said IC chip through one of said plurality of electrically conductive columns.

28. A method for forming a wafer-level package for flip chip attachment according to claim 27, wherein said pliable film is a polymeric-based film selected from the group consisting of a polyimide film, a polyamide film, a polyester film and a PTFE film.

29. A method for forming a wafer-level package for flip chip attachment according to claim 27 further comprising the step of filling said plurality of apertures with a high melting point solder material.

30. A method for forming a wafer-level package for flip chip attachment according to claim 27, wherein said step of filling said plurality of apertures with an electrically conductive material being carried out by a screen printing or a solder injection molding technique.

31. A method for forming a wafer-level package for flip chip attachment according to claim 27 further comprising the step of forming said plurality of solder balls on said pliable film by a technique selected from the group consisting of solder injection molding, solder ball preform placement and solder paste screening.

32. A method for forming a wafer-level package for flip chip attachment according to claim 27 further comprising the step of forming said plurality of solder balls in a solder such as eutectic Pb/Sn.

33. A method for forming a wafer-level package for flip chip attachment according to claim 27 further comprising the steps of;

severing said IC chip from said wafer, and encapsulating said IC chip in a molding compound exposing said plurality of solder balls.

34. A method for forming an IC chip/leadframe package comprising the steps of:

providing an IC chip having a plurality of conductive pads in an active surface, providing a leadframe equipped with a plurality of lead fingers for making electrical connections with said IC chip, attaching an electrically insulating film to said active surface of the IC chip and said plurality of lead fingers, said electrically insulating film having a plurality of apertures therethrough exposing said plurality of conductive pads and said plurality of lead fingers, filling said plurality of apertures with an electrically conductive material making electrical connection with said plurality of conductive pads and forming a plurality of conductive runners on top of said electrically insulating film such that each runner electrically connecting a conductive pad to a lead finger, and encapsulating said IC chip and said plurality of lead fingers in a molding compound.

35. A method for forming an IC chip/leadframe package according to claim 34, wherein said electrically insulating film is a polymeric-based film selected from the group consisting of a polyimide film, a polyamide film, a polyester film and a PTFE film.

36. A method for forming an IC chip/leadframe package according to claim 34 further comprising the step of providing said leadframe in a metal comprises copper.

37. A method for forming an IC chip/leadframe package according to claim 34 further comprising the step of filling said plurality of apertures with a high melting point solder material.

38. A method for forming an IC chip/leadframe package according to claim 34 further comprising the step of filling said plurality of apertures with an electrically conductive material by a solder injection molding or a screen printing technique.

39. A method for forming a chip-on-flex package comprising the steps of:

providing an IC chip having a plurality of conductive pads in an active surface, providing a flexible film equipped with a plurality of apertures and a plurality of thin film wiring on a top surface, and filling said plurality of apertures with an electrically conductive material when a bottom surface of said flexible film is positioned juxtaposed to said active surface of said IC chip such that a plurality of conductive runners are formed on said top surface of the flexible film and a plurality of conductive columns are formed in said plurality of apertures for providing electrical communication between said plurality of conductive pads on the IC chip and said plurality of thin film wiring on the flexible film.

40. A method for forming a chip-on-flex package according to claim 39 further comprising the step of providing said flexible film in a flexible circuitry.

41. A method for forming a chip-on-flex package according to claim 39 further comprising the step of providing a pre-amp chip for use in a disk drive application.

42. A method for forming a chip-on-flex package according to claim 39 further comprising the step of filling said plurality of apertures with a solder material that comprises lead.

43. A method for forming a chip-on-flex package according to claim 39 further comprising the step of filling said plurality of apertures by a solder injection molding or a screen printing technique.

44. A method for forming a chip-on-flex package according to claim 39 further comprising the step of providing said flexible film made of a material selected from the group consisting of polyimide, polyamide, polyester and PTFE.

* * * * *